United States Patent
Huang et al.

(10) Patent No.: US 12,454,769 B2
(45) Date of Patent: Oct. 28, 2025

(54) MULTIZONE LAMP CONTROL AND INDIVIDUAL LAMP CONTROL IN A LAMPHEAD

(71) Applicant: Applied Materials, Inc., Santa Clara, CA (US)

(72) Inventors: Yi-Chiau Huang, Fremont, CA (US); Errol Antonio C. Sanchez, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1058 days.

(21) Appl. No.: 16/529,066

(22) Filed: Aug. 1, 2019

(65) Prior Publication Data

US 2020/0045776 A1     Feb. 6, 2020

Related U.S. Application Data

(60) Provisional application No. 62/714,159, filed on Aug. 3, 2018.

(51) Int. Cl.
    *C30B 25/10*      (2006.01)
    *C23C 16/455*      (2006.01)
    (Continued)

(52) U.S. Cl.
    CPC ........ *C30B 25/105* (2013.01); *C23C 16/4585* (2013.01); *C23C 16/46* (2013.01);
    (Continued)

(58) Field of Classification Search
    CPC ... C23C 16/45504; C23C 16/46; C23C 16/48; C23C 16/481; C23C 16/482;
    (Continued)

(56) References Cited

U.S. PATENT DOCUMENTS

| | | | |
|---|---|---|---|
| 5,108,792 A | * | 4/1992 | Anderson ............... C30B 25/14 |
| | | | 118/725 |
| 5,268,989 A | * | 12/1993 | Moslehi ............ H01L 21/67115 |
| | | | 118/725 |

(Continued)

FOREIGN PATENT DOCUMENTS

| | | |
|---|---|---|
| CN | 102077319 A | 5/2011 |
| CN | 104871299 A | 8/2015 |

(Continued)

OTHER PUBLICATIONS

International Search Report and Written Opinion for Application No. PCT/US2019/041083 Oct. 30, 2019.

(Continued)

*Primary Examiner* — Kurt Sweely
(74) *Attorney, Agent, or Firm* — Patterson + Sheridan, LLP (57) ABSTRACT

A method and apparatus for processing a semiconductor substrate is described. A substrate processing apparatus is disclosed that includes a process chamber, a substrate support disposed inside the process chamber, a plurality of lamps arranged in a lamphead and positioned proximate to the substrate support, a gas source for providing a purge gas in a lateral flow path across the substrate support, and a controller that differentially adjusts power to individual lamps of the plurality of lamps based on a direction of the flow path.

20 Claims, 4 Drawing Sheets

(51) Int. Cl.
  *C23C 16/458* (2006.01)
  *C23C 16/46* (2006.01)
  *C23C 16/48* (2006.01)
  *C23C 16/52* (2006.01)
  *C30B 25/16* (2006.01)
  *H01L 21/67* (2006.01)

(52) U.S. Cl.
  CPC ............ *C23C 16/482* (2013.01); *C30B 25/16* (2013.01); *H01L 21/67115* (2013.01); *C23C 16/45504* (2013.01); *C23C 16/52* (2013.01); *H01L 21/67248* (2013.01); *H01L 21/67288* (2013.01)

(58) Field of Classification Search
  CPC ................ C23C 16/4585; C23C 16/52; H01L 21/67115; H01L 21/67288; H01L 21/67248
  See application file for complete search history.

(56) References Cited

U.S. PATENT DOCUMENTS

| | | | |
|---|---|---|---|
| 5,650,082 A * | 7/1997 | Anderson | C23C 16/481 219/390 |
| 6,717,158 B1 | 4/2004 | Gat et al. | |
| 7,976,634 B2 | 7/2011 | Carlson | |
| 8,404,571 B2 * | 3/2013 | Hashimoto | H01L 21/0254 117/106 |
| 8,663,390 B2 | 3/2014 | Carlson | |
| 8,772,055 B1 * | 7/2014 | Ranish | H01L 21/67115 118/667 |
| 9,230,837 B2 | 1/2016 | Ranish | |
| 9,580,835 B2 | 2/2017 | Ranish | |
| 9,856,580 B2 | 1/2018 | Sanchez | |
| 9,922,889 B2 | 3/2018 | Ono | |
| 9,929,027 B2 | 3/2018 | Ranish et al. | |
| 10,077,508 B2 | 9/2018 | Ranish | |
| 10,297,514 B2 | 5/2019 | Ono | |
| 10,490,465 B2 | 11/2019 | Ono | |
| 10,727,093 B2 | 7/2020 | Brillhart | |
| 2004/0069234 A1 | 4/2004 | Kasai et al. | |
| 2008/0064128 A1 * | 3/2008 | Ishigaki | H01L 21/67253 250/492.2 |
| 2008/0210163 A1 | 9/2008 | Carlson | |
| 2008/0280048 A1 | 11/2008 | Kasai et al. | |
| 2009/0095731 A1 | 4/2009 | Asakura et al. | |
| 2009/0214193 A1 | 8/2009 | Suzuki et al. | |
| 2011/0097880 A1 | 4/2011 | Hashimoto et al. | |
| 2011/0259432 A1 | 10/2011 | Carlson et al. | |
| 2014/0175054 A1 | 6/2014 | Carlson | |
| 2014/0199785 A1 | 7/2014 | Ranish | |
| 2014/0273419 A1 | 9/2014 | Ranish | |
| 2015/0047566 A1 * | 2/2015 | Sanchez | C30B 29/06 118/728 |
| 2015/0147053 A1 | 5/2015 | Ranish et al. | |
| 2015/0340257 A1 | 11/2015 | Brillhart | |
| 2016/0138188 A1 | 5/2016 | Ranish | |
| 2017/0125312 A1 * | 5/2017 | Ono | C23C 14/48 |
| 2017/0130359 A1 | 5/2017 | Ranish | |
| 2017/0362702 A9 | 12/2017 | Carlson | |
| 2018/0151455 A1 | 5/2018 | Ono | |
| 2019/0181057 A1 | 6/2019 | Ono | |

FOREIGN PATENT DOCUMENTS

| | | |
|---|---|---|
| CN | 105493229 A | 4/2016 |
| CN | 105745741 A | 7/2016 |
| CN | 106715753 A | 5/2017 |
| JP | 2017-092102 A | 5/2017 |
| JP | 2017521874 A | 8/2017 |
| KR | 20030074831 A | 9/2003 |
| KR | 20090091650 A | 8/2009 |
| TW | I613730 | 2/2008 |
| TW | 200835892 A | 9/2008 |
| TW | 201518563 A | 5/2015 |
| WO | 2009157514 A1 | 12/2009 |
| WO | 2013-042027 A2 | 3/2013 |
| WO | 2014-113133 A1 | 7/2014 |
| WO | 2015026491 A1 | 2/2015 |
| WO | 2015076943 A1 | 5/2015 |
| WO | 2016036868 A1 | 3/2016 |

OTHER PUBLICATIONS

Office Action for Taiwan Application No. 108124638 dated Nov. 9, 2022.
Search Report for Taiwan Application No. 108124638 dated Nov. 7, 2022.
Office Action for Korean Application No. 10-2021-7005849 dated Jan. 26, 2023.
Office Action for Korean Application No. 10-2021-7005849 dated Jul. 11, 2023.
Office Action for Korean Application No. 10-2021-7005849 dated Jan. 8, 2024.
Office Action for Chinese Application No. 201910711874.0 dated Aug. 30, 2024.
Search Report for Chinese Application No. 201910711874.0 dated Aug. 27, 2024.
Office Action for Korean Application No. 2021-7005849 dated Aug. 10, 2022.

* cited by examiner

MULTIZONE LAMP CONTROL AND INDIVIDUAL LAMP CONTROL IN A LAMPHEAD

CROSS-REFERENCE TO RELATED APPLICATION

This application claims benefit of U.S. Provisional Patent Application Ser. No. 62/714,159, filed Aug. 3, 2018, which is incorporated by reference herein.

FIELD

Methods and apparatus for semiconductor processing are disclosed herein. More specifically, embodiments disclosed herein relate to methods and apparatus for controlling particle contamination in an epitaxy process.

BACKGROUND

Epitaxy is a process that is used extensively in semiconductor processing to form very thin material layers on semiconductor substrates. These layers frequently define some of the smallest features of a semiconductor device, and they may have a high quality crystal structure if the electrical properties of crystalline materials are desired. To form these layers, a deposition precursor is provided to a processing chamber having a susceptor on which a substrate is disposed, and the substrate is heated to a temperature that favors growth of a material layer having desired properties. Due to the small feature size of the semiconductor devices formed on the substrate, the amount of particles on the substrate must be kept at a minimum.

However, particles may adhere to a to-be-processed substrate during the transfer thereof into the processing chamber. For example, in a process where process gases are provided at a side of the substrate to flow across the substrate surface, a gas flowing into the chamber during transfer of the to-be-processed substrate may generate particles that land on the to-be-processed substrate. The particles may be dislodged from chamber walls which are then entrained into the gas flow. In addition, the temperature of the susceptor may be non-uniform such that the substrate warps upon initial contact therewith. A retention area on the substrate for particles may be greater or less depending on the orientation of the warped profile of the substrate relative to the gas flow direction. If the substrate adopts a warped shape that presents a large cross-section within the gas flow path, particle deposition on the substrate is greater than when the substrate adopts a shape presenting a small cross-section within the gas flow path.

Method and apparatus are needed to prevent or minimize particle contamination of a to-be-processed substrate.

SUMMARY

A method and apparatus for processing a semiconductor substrate is described. In one embodiment, a substrate processing apparatus is disclosed that includes a process chamber, a substrate support disposed inside the process chamber, a plurality of lamps arranged in a housing and positioned proximate to the substrate support, a gas source for providing a purge gas in a lateral flow path across the substrate support, and a controller that differentially adjusts power to individual lamps of the plurality of lamps based on a direction of the flow path.

In another embodiment, a substrate processing apparatus is disclosed that includes a process chamber, a substrate support disposed inside the process chamber, an array of lamps arranged in a lamphead and positioned proximate to the substrate support, the array of lamps comprising at least an inner zone, a central zone and an outer zone, the outer zone corresponding with a perimeter of the substrate support, a gas source for providing a purge gas in a lateral flow path across the substrate support, and a controller that adjusts power to the lamps in the outer zone based on a direction of the flow path.

In another embodiment, a method for processing a substrate is disclosed that includes heating a susceptor in a process chamber using a lamp array comprising a plurality of lamps positioned below the susceptor, the plurality of lamps comprising an inner zone and an outer zone, the outer zone corresponding to a perimeter of the susceptor, flowing a purge gas in a lateral flow path across the susceptor, wherein the heating comprises providing power to one or more of the plurality of lamps in the outer zone of the lamp array while not providing power to other lamps in the outer zone, the one or more lamps positioned at a leading edge or a trailing edge of the susceptor based on the flow path, and transferring a substrate to the susceptor after the heating.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized with other embodiments without specific recitation.

DETAILED DESCRIPTION

A method and apparatus for preventing or minimizing particle contamination of a to-be-processed substrate is provided. In one embodiment, a process chamber is disclosed which includes a susceptor disposed adjacent to a lamphead. The lamphead includes a plurality of energy sources, such as lamps, that direct electromagnetic energy toward a surface of the susceptor to thereby heat the susceptor. The lamphead includes multiple concentric zones, and one or more of the zones includes lamps therein that may be individually controlled. The individual control of one or more lamps provides enhanced temperature control of the susceptor.

Figure 1:
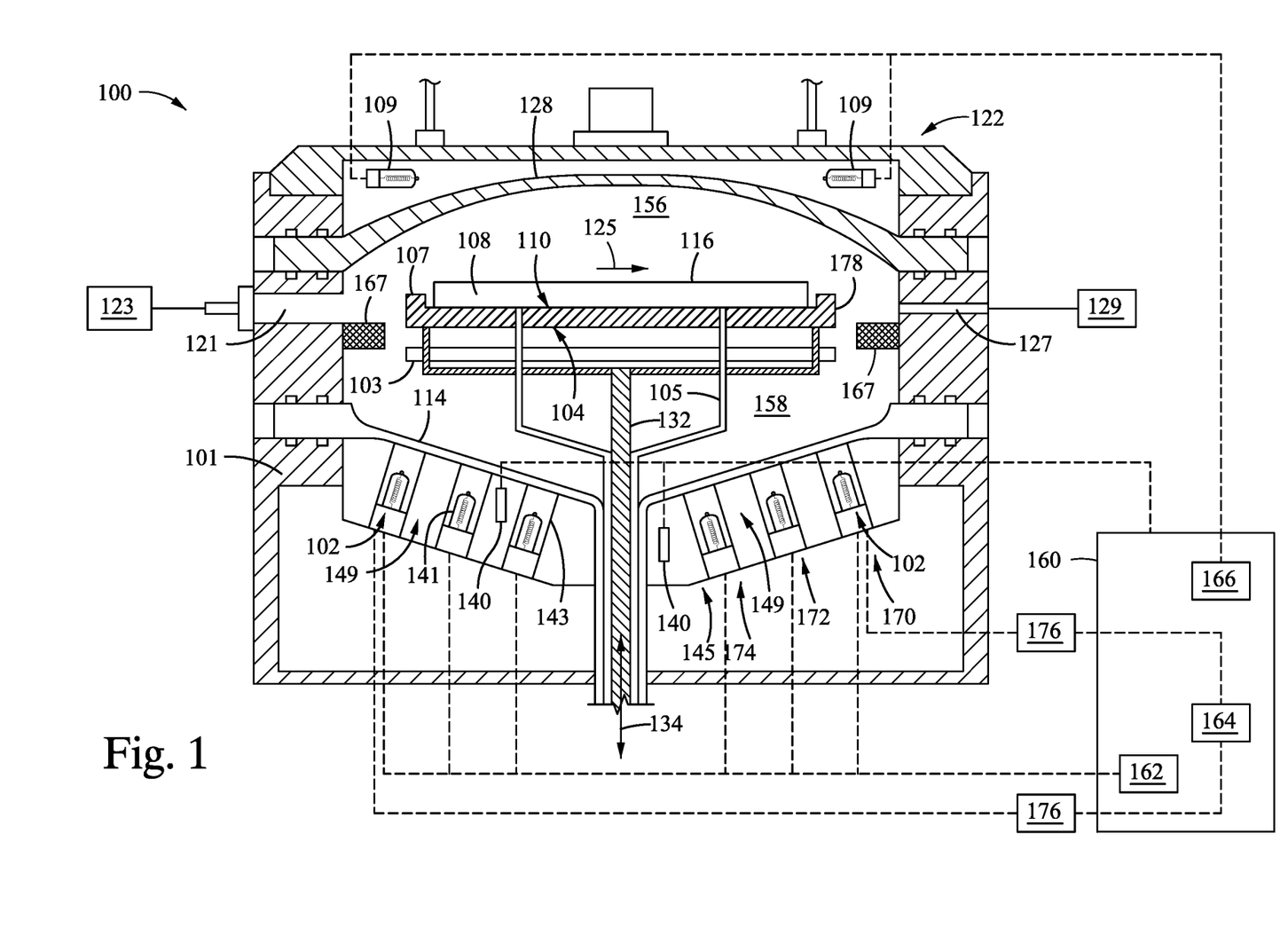
FIG. 1 is a schematic cross-sectional view of a process chamber according to one embodiment.

FIG. 1 is a schematic cross-sectional view of a process chamber 100 according to one embodiment. The process chamber 100 may be used to process one or more substrates, including a process of depositing a material on an upper surface of a substrate 108. The process chamber 100 generally includes an energy module 102 for heating, among other components, a backside 104 of a substrate support or susceptor 107 disposed within the process chamber 100. The susceptor 107 may be a circular platter-like (e.g., disk-shaped) substrate support as shown. The susceptor 107 is located within the process chamber 100 between an upper shell 128 and a lower shell 114 of the chamber 100. The substrate 108 (not to scale) can be brought into the process chamber 100 and placed onto the susceptor 107 through a loading port 103.

The susceptor 107, connected to a central shaft 132, is shown in an elevated processing position, but is repositioned, by an actuator (not shown) coupled to the central shaft 132, to a loading position below the processing position. A to-be-processed substrate, such as the substrate 108, is transferred into the process chamber 100 though the loading port 103 and placed onto lift pins 105. The lift pins 105 are coupled to a shaft disposed about the central shaft 132 and pass through holes in the susceptor 107 when the susceptor 107 is in the loading position. The susceptor 107 then may be actuated upward in an axial direction 134 to the processing position to contact the substrate 108, with a device side 116 of the substrate 108 facing upwardly, on a front side 110 of the susceptor 107.

The susceptor 107, while located in the processing position, divides the internal volume of the process chamber 100 into a process gas region 156 (above the substrate) and a purge gas region 158 (below the susceptor 107). The susceptor 107 is rotated during processing by the central shaft 132 connected thereto to minimize the effect of reactive precursor depletion and thermal and process gas flow spatial anomalies within the process chamber 100 and thus facilitate uniform processing of the substrate 108. The susceptor 107 is supported by the central shaft 132, which also moves the substrate 108 in the axial direction 134 during loading and unloading, and in some instances during processing of the substrate 108. The susceptor 107 is typically formed from a material having low thermal mass or low heat capacity, so that the susceptor will heat up and cool down quickly. The susceptor 107 here is formed from silicon carbide or graphite coated with silicon carbide to absorb radiant energy from the energy module 102 and heat the substrate 108.

Gases may be provided to a gas inlet 121 from a gas source 123. The gas source 123 may provide purge gases as well as precursor gases flowed onto the device side 116 of the substrate 108. The gases are generally provided along a flow path 125 across the device side 116 of the substrate 108 to an exit port 127 of the chamber. Gases are exhausted through the exit port 127 via a pump 129.

However, the gas flowing along the flow path 125 may contain particles entrained therein. For example, a purge gas flowing into the chamber during transfer of the to-be-processed substrate may transport particles that land on the to-be-processed substrate. The particles may be dislodged from chamber walls, and the dislodged particles are entrained into the flow path 125. In addition, the temperature of the susceptor may be such that the substrate 108 warps upon initial contact therewith. A retention area for particles may be greater or less depending on the orientation of the warpage relative to the direction of the flow path 125. If the substrate 108 adopts a shape that presents a large cross-section within the flow path 125, particle deposition is greater than when the substrate 108 adopts a shape presenting a small cross-section within the flow path 125.

In general, the upper shell 128 and the lower shell 114 are typically formed from a substantially optically transparent material such as quartz. These materials allow electromagnetic energy from the energy module 102 to pass therethrough to the process gas region 156.

The energy module 102 comprises one or more lamps 141, or other sources of electromagnetic radiation such as lasers, LED's, and VCSELs, disposed in a housing 145. The energy module 102 is disposed adjacent to and beneath the lower shell 114 to heat the substrate 108 as the process gas passes thereover, thereby facilitating a reaction causing the deposition of a material onto the device side 116 of the substrate 108. In FIG. 1, one or more lamps 109 are disposed above the upper shell 128 to provide electromagnetic energy to the device side 116 of the substrate 108, but the upper lamps are optional. The central shaft 132 passes through the energy module 102 and extends to the outside of the process chamber 100.

The energy module 102 of FIG. 1 heats the substrate 108 to a temperature within a range of about 200 degrees Celsius to about 1200 degrees Celsius, such as about 300 degrees Celsius to about 950 degrees Celsius. The energy module 102 may include an optional reflector 143 surrounding the lamps 141. The energy module 102 includes a housing 145, which houses the lamps 141, and which may be cooled during or after processing by, for example, a cooling fluid introduced into channels 149 located between the lamps 141. In some cases, the housing 145 may be in contact with the lower shell 114. A controller 160 controls the power supplied to each lamp 141 of the energy module 102.

A circular shield 167 may be optionally disposed around the susceptor 107 and coupled to sidewall of the chamber body 101. The shield 167 prevents or minimizes leakage of heat and/or light from the energy module 102 to the device side 116 of the substrate 108. In addition, the shield 167 absorbs electromagnetic energy from the energy module 102 which heats the shield 167 and pre-heats the process gases passing thereover. The shield 167 may be made from CVD SiC coated sintered graphite, SiC, or a similar opaque material that is resistant to chemical breakdown by process and cleaning gases.

A reflector 122 may be optionally placed outside the upper shell 128 to reflect infrared light that is radiating from the substrate 108 back onto the substrate 108. Due to the reflected infrared light, the efficiency of the heating of the substrate 108 will be improved by reflecting electromagnetic energy that would otherwise not be utilized to heat the substrate 108.

A plurality of thermal radiation sensors 140, which may be pyrometers, are disposed in the process chamber 100 for monitoring temperatures of the substrate 108. The sensors 140 are typically disposed at different locations in the process chamber 100. Some sensors may be disposed in the housing 145 to monitor the thermal state of the susceptor 107, while others may be disposed in the reflector 122 to monitor the thermal state of the substrate 108 directly. Sensors disposed in the housing 145 are typically located between the lamps, and may benefit from the cooling applied to the housing 145. The thermal sensors send data to the controller 160, which in turn can modulate power to the lamps based on the data to control the process.

The energy module 102 is utilized to heat the susceptor 107 before a substrate is placed on the susceptor 107. For example, the energy module 102 provides thermal energy to the back side 104 of the susceptor 107 before a to-be-processed substrate is positioned on the susceptor 107. The inventors have discovered that utilizing the energy module 102 to heat the susceptor 107 prior to transfer of a to-be-processed substrate thereto leads to warping of the substrate when placed into contact with the susceptor 107.

Warpage is mostly caused due to uneven heating and therefore uneven thermal expansion across a substrate. Differential or preferential local heating from lamp power management can modulate the thermal expansion within-substrate and makes the substrate assume certain warped shapes that make the substrate more susceptible to particle addition and other issues.

As discussed above, warping leads to particle contamination of the substrate, depending on the orientation of the warpage relative to the flow path 125. For example, a retention area for particles may be greater or less depending on the orientation of the warpage relative to the direction of the flow path 125. If the substrate 108 adopts a shape that presents a large cross-section within the flow path 125, particle deposition is greater than when the substrate 108 adopts a shape presenting a small cross-section within the flow path 125. Differential heating of the susceptor 107 can counter thermal gradients in the susceptor 107 that cause unwanted warping, thus minimizing or controlling deformation of a to-be-processed substrate.

The lamps 141 of the energy module 102 may be divided into radial zones, such as an outer zone 170, a central zone 172, and an inner zone 174. While three zones 170, 172 and 174 are shown, the energy module 102 may include only two zones, such as the inner zone 174 and the outer zone 170. One or more of the individual lamps 141 within each of the outer zone 170, the central zone 172, and/or the inner zone 174 is individually controlled.

In one embodiment, a power supply 162 controls power application to each of the inner zone 174 and the central zone 172. For example, all of the lamps 141 of the inner zone 174 and the central zone 172 are controlled by the first power supply 162, while a second power supply 164 is utilized to independently control each of the lamps 141 of the outer zone 170. Here, the second power supply 164 includes multiple thyristors 176, such as silicon controlled rectifiers (SCRs). Each thyristor 176 is dedicated to a lamp 141 to independently control power to each lamp 141 of the outer zone 170 in order to control heating of a perimeter 178 of the susceptor 107. Likewise, the third power supply 166 may be utilized to control power application to the lamps 109.

Figure 2A:
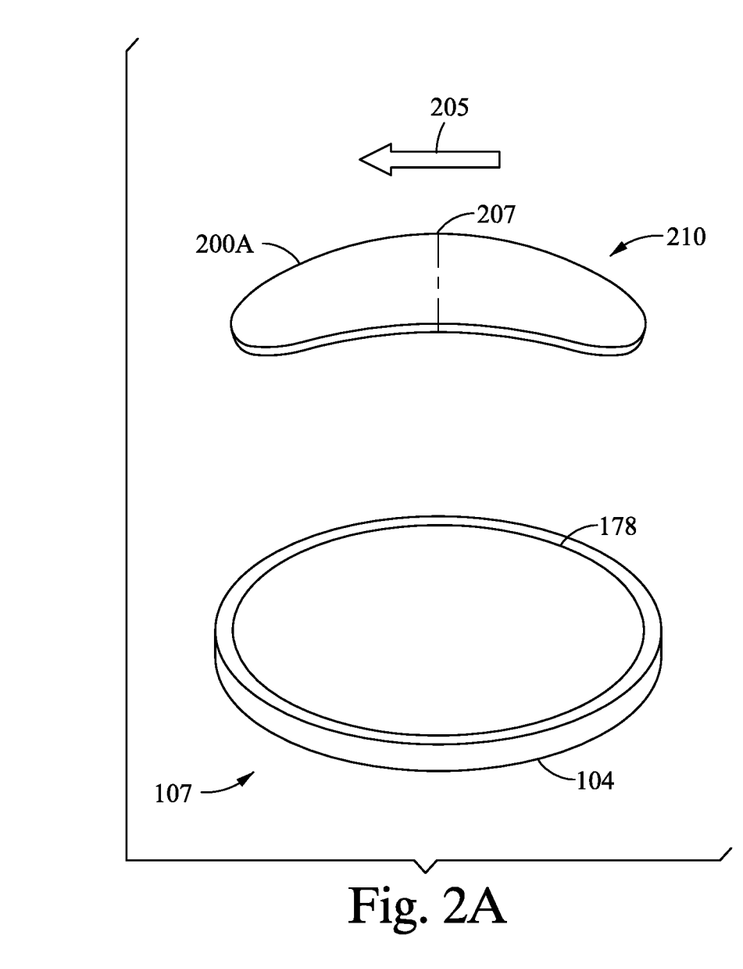
FIGS. 2A and 2B are exploded isometric views of a susceptor and a to-be-processed substrate showing warpage of the to-be-processed substrate.
Figure 2B:
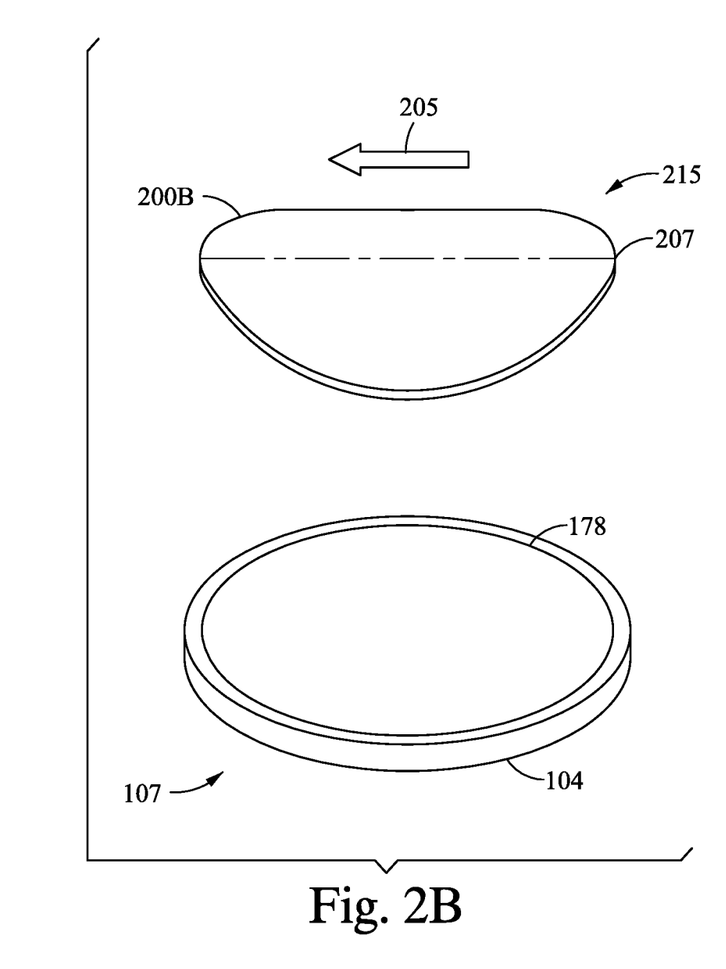
Figure 2C:
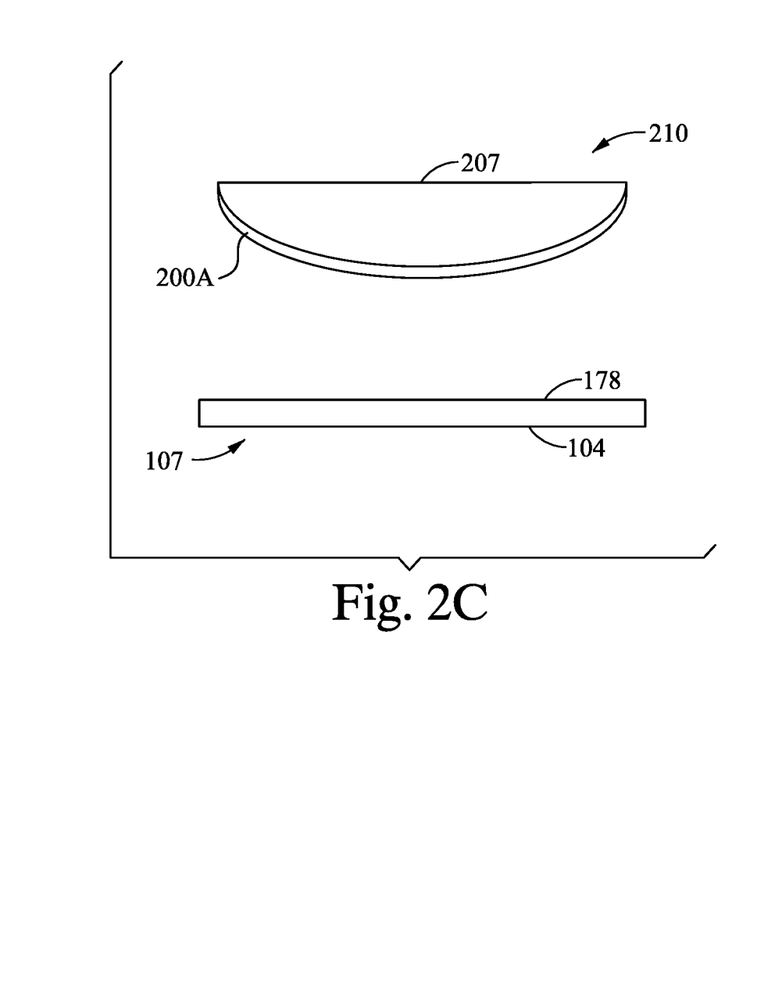
FIGS. 2C and 2D are side views of the susceptor and the to-be-processed substrate of FIGS. 2A and 2B, respectively, rotated 90 degrees.
Figure 2D:
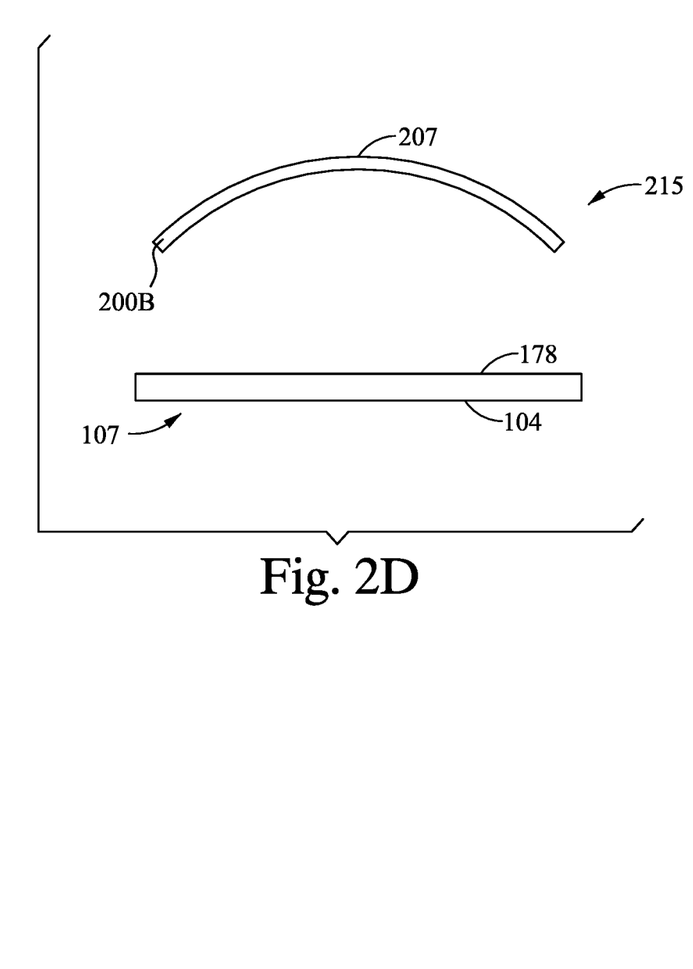

FIGS. 2A-2D are exploded views of a susceptor 107 and a to-be-processed substrate showing various warpage profiles of the to-be-processed substrate. FIGS. 2A and 2B are exploded isometric views of the susceptor 107 and the to-be-processed substrate, and FIGS. 2C and 2D are side views of the susceptor 107 and the to-be-processed substrate of FIGS. 2A and 2B, respectively, rotated 90 degrees. The to-be-processed substrate is shown as a warped substrate 200A in FIGS. 2A and 2C and a warped substrate 200B in FIGS. 2B and 2D. A gas flow direction 205 is indicated by an arrow in both of FIGS. 2A and 2B and is the same as the flow path 125 shown and described in FIG. 1. The gas flow direction is not shown in FIGS. 2C and 2D as the gas flow direction is into the page due to the rotation of the views. The gas flow may be a purge gas that is flowed during the substrate transfer processes. The warpage of the to-be-processed substrates in FIGS. 2A and 2B is caused by a delta in the temperature profile of the susceptor 107. Additionally, variations in transfer processes including handoff of the to-be-processed substrate, and tilt of the susceptor 107, as well as positions of the lamps 141 and/or quality of the lamps 141, can lead to warping of the to-be-processed substrate into an arbitrary shape or orientation. As explained in more detail in below, this warpage presents a profile relative to the gas flow direction 205 that may provide a greater surface area where particles entrained in the gas flow may adhere to the to-be-processed substrate. The shape and/or orientation of the warpage can lead to a greater or lesser surface area for particles to adhere to the to-be-processed substrate depending on the orientation of the to-be-processed substrate relative to the gas flow direction 205.

In FIGS. 2A and 2B, the to-be-processed substrate, for example warped substrate 200A or warped substrate 200B, is warped such that a curvature midpoint (indicated as a dashed line 207) is formed. In FIG. 2A, the substrate 200A is oriented in the process chamber 100 so the curvature midpoint 207 is oriented in a direction that is substantially perpendicular to the gas flow direction 205. In FIG. 2B, the curvature midpoint 207 is oriented in a direction that is substantially parallel to the gas flow direction 205.

While warpage is not desired, the orientation of the warped substrate 200B presents a profile relative to the gas flow direction 205 that is less likely to become contaminated by particles entrained in the gas flow. For example, in the case of the warped substrate 200A, a profile 210 facing the gas flow direction 205 is greater than a profile 215 of the warped substrate 200B facing the gas flow direction 205 due to the orientation of the warpage in relation to the gas flow direction 205. As such, differential heating of the susceptor 107 is provided as disclosed herein to minimize warpage such that the to-be-processed substrate does not warp (or warping is greatly minimized). Alternatively, the differential heating of the susceptor 107 as disclosed herein is provided to control warpage to present the profile 215 (as opposed to the profile 210 of the warped substrate 200A).

Figure 3A:
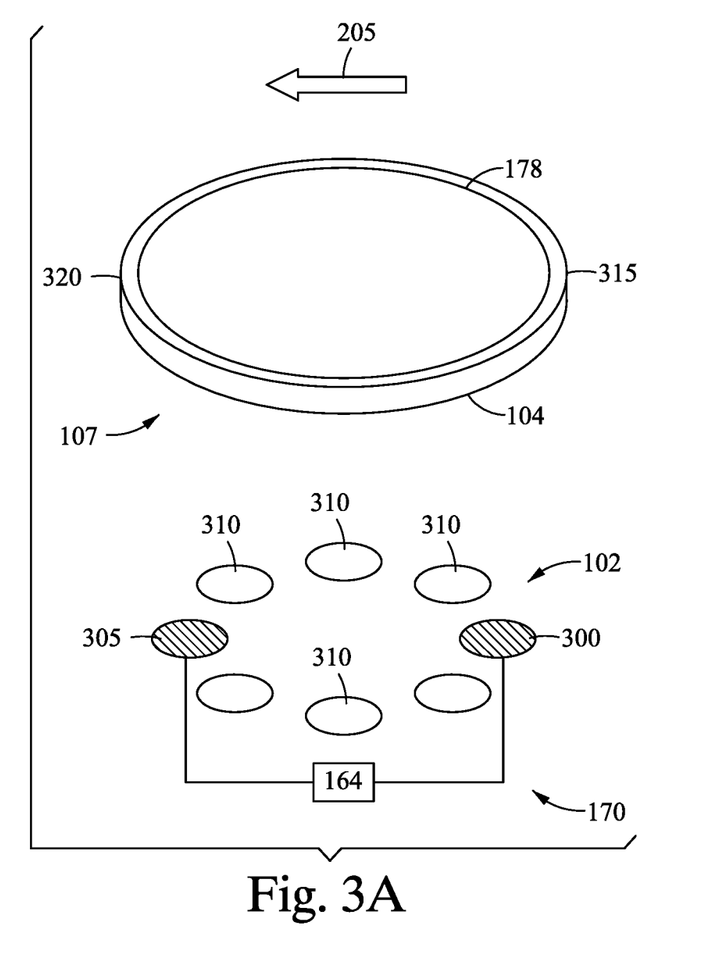
FIG. 3A is an isometric view of a susceptor and a lamphead showing one embodiment of differential heating of the susceptor.

FIG. 3A is an isometric view of a susceptor 107 having the energy module 102 positioned thereunder. A leading edge lamp 300 and a trailing edge lamp 305 (relative to the gas flow direction 205) as well as other lamps 310 in the outer zone 170 are shown. The inner zone 174 and the central zone 172 are not shown for clarity. In this embodiment, the leading edge lamp 300 and the trailing edge lamp 305 are powered by the second power supply 164 while the other lamps 310 are powered at a lower energy level. Alternatively or additionally, the lamps 310 of the inner zone 174 and the central zone 172 are powered uniformly (e.g., at the same power level). Thus, the susceptor 107 is heated in a non-uniform manner, which heats a leading edge 315 as well as a trailing edge 320, relative to the gas flow direction 205, of the perimeter 178 of the susceptor 107 to a temperature greater than other portions of the perimeter 178 of the susceptor 107. This differential heating reduces, minimizes or controls the warpage of a to-be-processed substrate positioned onto the susceptor 107.

Figure 3B:
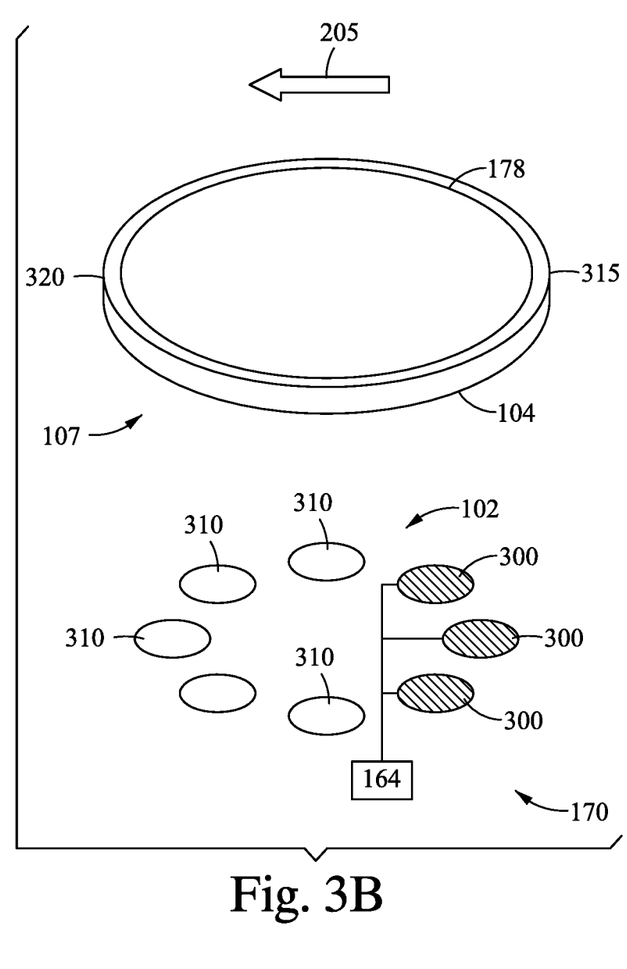
FIG. 3B is an isometric view of a susceptor and a lamphead showing another embodiment of differential heating of the susceptor.

FIG. 3B is an isometric view of a susceptor 107 having the energy module 102 positioned thereunder. One or more leading edge lamps 300 (relative to the gas flow direction 205) as well as other lamps 310 in the outer zone 170 of the lamphead 145 are shown. The inner zone 174 and the central zone 172 are not shown for clarity. In this embodiment, one or more leading edge lamps 300 are powered by the second power supply 164 while the other lamps 310 are not powered at a lower energy level. Alternatively or additionally, the lamps 310 of the inner zone 174 and the central zone 172 are powered uniformly (e.g., at the same power level). Thus, the susceptor 107 is heated in a non-uniformly which heats a leading edge 315 of the perimeter 178 of the susceptor 107 to a temperature greater than other portions of the perimeter 178. This differential heating reduces, minimizes or controls the warpage of a to-be-processed substrate positioned onto the susceptor 107.

The above described embodiments are directed to controlling the anisotropy in heating a to-be-processed substrate to minimize, prevent, or control warping of the to-be-processed substrate. In some embodiments, a controlled warpage provided by the method and apparatus disclosed herein provides a consistent shape, profile and/or warp orientation in a to-be-processed substrate that minimizes particle adherence onto the to-be-processed substrate. The above described embodiments of differential heating of the susceptor 107 may be provided immediately before the to-be-processed substrate contacts the susceptor 107 up to about 10 seconds to about 40 seconds, after which the to-be-processed substrate flattens and/or uniformly contacts the susceptor 107.

While the foregoing is directed to embodiments of the present invention, other and further embodiments of the invention may be devised without departing from the basic scope thereof, and the scope thereof is determined by the claims that follow.

The invention claimed is:

1. A substrate processing apparatus, comprising:
a process chamber;
a substrate support disposed inside the process chamber;
a plurality of lamps arranged in a lamphead and positioned proximate to the substrate support, the plurality of lamps forming a plurality of lamp zones comprising at least an inner zone and an outer zone, the outer zone corresponding to a perimeter of the substrate support;
an inlet gas port configured to direct a gas in a lateral flow path across the substrate support to an exit gas port, the lateral flow path defining a leading edge of the substrate support and a trailing edge of the substrate support; and
a controller configured to differentially adjust power to the plurality of lamp zones and heat the substrate support in a non-uniform manner to create a temperature differential across the substrate support before a substrate is positioned on the substrate support by providing power to a portion of the lamps in the outer zone while providing a lower power level to other lamps in the outer zone.

2. The substrate processing apparatus of claim 1, wherein each of the lamp zones of the plurality of lamp zones include two or more lamps.

3. The substrate processing apparatus of claim 2, wherein the plurality of lamp zones are concentric and comprise the inner zone, a central zone and the outer zone.

4. The substrate processing apparatus of claim 2, wherein the controller is configured to control power to any of one or more select lamp zones of the plurality of lamp zones positioned at the leading edge or the trailing edge.

5. The substrate processing apparatus of claim 4, wherein the one or more select lamp zones positioned at the leading edge or the trailing edge is part of a concentric arrangement.

6. The substrate processing apparatus of claim 4, wherein the controller is configured to provide power that is higher or lower to any select lamp zones at the leading edge than anywhere else.

7. The substrate processing apparatus of claim 4, wherein the controller is configured to provide power that is higher or lower to any select lamp zones at the leading edge and trailing edge than anywhere else.

8. The substrate processing apparatus of claim 3, wherein the lateral flow path defines the leading edge and the trailing edge of the substrate support, and the controller is configured to control power to the lamps in the outer zone positioned at the leading edge and the trailing edge.

9. The substrate processing apparatus of claim 2, wherein the controller is configured to provide power that is higher to lamps at the leading edge as compared to power provided to other lamps.

10. The substrate processing apparatus of claim 2, wherein the controller is configured to provide power that is higher to lamps at the leading edge and the trailing edge as compared to power provided to other lamps.

11. A substrate processing apparatus, comprising:
a process chamber;
a substrate support disposed inside the process chamber;
an array of lamps arranged in a lamphead and positioned proximate to the substrate support, the array of lamps comprising a plurality of lamp zones, the plurality of lamp zones comprising at least an inner zone and an outer zone, the outer zone corresponding to a perimeter of the substrate support;
an inlet gas port configured to direct a purge gas in a lateral flow path across the substrate support to a gas exit port; and
a controller configured to differentially adjust power to the lamps in the outer zone to heat the substrate support in a non-uniform manner to create a temperature differential across the substrate support before a substrate is positioned on the substrate support by providing power to a portion of the lamps in the outer zone while providing a lower power level to other lamps in the outer zone.

12. The substrate processing apparatus of claim 11, wherein the lateral flow path defines a leading edge and a trailing edge of the substrate support, and the controller is configured to control power to the lamps in the outer zone positioned at the leading edge or the trailing edge.

13. The substrate processing apparatus of claim 12, wherein the controller is configured to provide power to a portion of the lamps at the leading edge while providing a lower power level to other lamps in the outer zone.

14. The substrate processing apparatus of claim 12, wherein the controller is configured to provide power to a portion of the lamps at the leading edge and the trailing edge while providing a lower power level to other lamps in the outer zone.

15. The substrate processing apparatus of claim 11, wherein the lateral flow path defines a leading edge and a trailing edge of the substrate support, and the controller is configured to control power to the lamps in the outer zone positioned at the leading edge and the trailing edge.

16. The substrate processing apparatus of claim 12, wherein the controller is configured to provide power that is higher to lamps at the leading edge as compared to power provided to other lamps.

17. The substrate processing apparatus of claim 12, wherein the controller is configured to provide power that is higher to lamps at the leading edge and the trailing edge as compared to power provided to other lamps.

18. A method for processing a substrate, the method comprising:
- heating a susceptor disposed in a process chamber using a lamp array arranged in a lamphead, the lamp array comprising a first plurality of lamps positioned below the susceptor and a second plurality of lamps above the susceptor, the first plurality of lamps comprising a plurality of lamp zones, the plurality of lamp zones comprising an inner zone, a central zone, and an outer zone, the outer zone corresponding to a perimeter of the susceptor;
- flowing a purge gas in a lateral flow path across the susceptor from an inlet gas port to a gas exit port, wherein the heating the susceptor is controlled by a controller and comprises:
  - differentially adjusting power to one or more of the first plurality of lamps in the outer zone of the lamp array while not providing power to other lamps in the outer zone to heat the susceptor in a non-uniform manner to create a temperature differential across the susceptor, the one or more lamps positioned at a leading edge or a trailing edge of the susceptor based on the lateral flow path; and
  - transferring a substrate to the susceptor after the heating of the susceptor.

19. The method of claim 18, wherein the controller provides power to one lamp of the first plurality of lamps at the leading edge and one lamp of the first plurality of lamps at the trailing edge.

20. The method of claim 18, wherein the controller provides power to two or more lamps of the first plurality of lamps at the leading edge.

* * * * *